(12) United States Patent
Kim et al.

(10) Patent No.: US 10,090,371 B2
(45) Date of Patent: *Oct. 2, 2018

(54) ORGANIC LIGHT EMITTING DIODE DISPLAY

(71) Applicant: SAMSUNG DISPLAY CO., LTD., Yongin-si, Gyeonggi-do (KR)

(72) Inventors: Mi Hae Kim, Yongin-si (KR); Min Ho Ko, Yongin-si (KR); Seung Woo Sung, Yongin-si (KR); Ki Myeong Eom, Yongin-si (KR); Jin Jeon, Yongin-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/630,632

(22) Filed: Jun. 22, 2017

(65) Prior Publication Data

US 2017/0294503 A1  Oct. 12, 2017

Related U.S. Application Data

(63) Continuation of application No. 14/700,657, filed on Apr. 30, 2015, now Pat. No. 9,691,837.

(30) Foreign Application Priority Data

Nov. 14, 2014  (KR) .......................... 10-2014-0158977

(51) Int. Cl.
*H01L 27/32* (2006.01)
*G09G 3/3233* (2016.01)
*H01L 29/786* (2006.01)

(52) U.S. Cl.
CPC ....... *H01L 27/3276* (2013.01); *G09G 3/3233* (2013.01); *H01L 27/3262* (2013.01);
(Continued)

(58) Field of Classification Search
CPC ............. H01L 27/3276; H01L 27/3262; H01L 27/3265; H01L 29/78696; H01L 27/32; G09G 3/3233
(Continued)

(56) References Cited

U.S. PATENT DOCUMENTS

| 7,405,852 B2 | 7/2008 | Brosnihan et al. |
| 9,261,694 B2 | 2/2016 | Payne et al. |

(Continued)

FOREIGN PATENT DOCUMENTS

| KR | 10-0570995 B1 | 4/2006 |
| KR | 10-0627266 B1 | 9/2006 |

(Continued)

*Primary Examiner* — Alexander Oscar Williams
(74) *Attorney, Agent, or Firm* — Lee & Morse, P.C.

(57) ABSTRACT

An organic light emitting diode display includes a plurality of pixels. At least one pixel is connected to a scan line receive a scan signal, a data line to receive a data signal, and voltage line to receive a driving voltage. The at least one pixel includes a switching transistor including a switching drain electrode to output the data voltage, a driving transistor including a driving source electrode connected to the switching drain electrode, and an organic light emitting diode connected to a driving drain electrode of the driving transistor. The driving source electrode is separated from the data line.

16 Claims, 9 Drawing Sheets

(52) U.S. Cl.
CPC . *H01L 27/3265* (2013.01); *G09G 2320/0238* (2013.01); *G09G 2320/0276* (2013.01); *H01L 29/78696* (2013.01)

(58) Field of Classification Search
USPC .......................................................... 257/40
See application file for complete search history.

(56) References Cited

U.S. PATENT DOCUMENTS

| | | |
|---|---|---|
| 9,691,837 B2* | 6/2017 | Kim .................... H01L 27/3276 |
| 9,786,725 B2* | 10/2017 | Pyon ................... H01L 27/3244 |
| 2007/0236424 A1 | 10/2007 | Kimura |
| 2008/0180385 A1 | 7/2008 | Yoshida et al. |
| 2013/0033194 A1 | 2/2013 | Kang et al. |
| 2013/0321485 A1 | 12/2013 | Eom et al. |
| 2015/0204561 A1 | 7/2015 | Sadwick et al. |
| 2015/0317932 A1 | 11/2015 | Zhou et al. |
| 2016/0141350 A1* | 5/2016 | Kim .................... H01L 27/3276 257/40 |
| 2016/0217733 A1 | 7/2016 | Kim et al. |
| 2016/0240565 A1 | 8/2016 | Kim et al. |
| 2016/0275857 A1* | 9/2016 | Pyon ................... H01L 27/3244 |
| 2016/0322442 A1* | 11/2016 | Lee .................... H01L 27/3262 |
| 2016/0322445 A1* | 11/2016 | Lee .................... H01L 51/5253 |
| 2017/0011685 A1* | 1/2017 | Jeon .................... G09G 3/3233 |
| 2017/0365651 A1* | 12/2017 | Lee ................... H01L 29/78696 |

FOREIGN PATENT DOCUMENTS

| | | |
|---|---|---|
| KR | 10-0627358 B1 | 9/2006 |
| KR | 10-2013-0097964 A | 9/2013 |
| KR | 10-2014-0018623 A | 2/2014 |

\* cited by examiner

ORGANIC LIGHT EMITTING DIODE DISPLAY

CROSS-REFERENCE TO RELATED APPLICATIONS

This is a continuation application based on pending application Ser. No. 14/700,657, filed Apr. 30, 2015, now U.S. Pat. No. 9,691,837, the entire contents of which is hereby incorporated by reference.

Korean Patent Application No. 10-2014-0158977, filed on Nov. 14, 2014, and entitled, "Organic Light Emitting Diode Display," is incorporated by reference herein in its entirety.

BACKGROUND

1. Field

One or more embodiments herein relate to an organic light emitting diode display.

2. Description of the Related Art

An organic light emitting display generates images using pixels that include organic light emitting diodes. Each diode includes an organic emission layer between two electrodes. In operation, electrons injected from one electrode and holes injected from the other electrode combine in the organic emission layer. As a result, excitons are formed. When the excitons change state, light is emitted. An organic light emitting display is therefore considered to be a self-emissive type of device.

Each pixel includes a plurality of thin film transistors, a storage capacitor, and wiring lines. The wiring lines include gate lines and data lines. When the wiring lines are close together or overlap, parasitic capacitance occurs which degrades display quality.

SUMMARY

In accordance with one or more embodiments, an organic light emitting diode display a substrate; a scan line on the substrate to transmit a scan signal; a data line and a driving voltage line crossing the scan line and to respectively transmit a data voltage and a driving voltage; a switching transistor connected to the scan line and the data line, the switching transistor including a switching drain electrode to output the data voltage; a driving transistor including a driving source electrode connected to the switching drain electrode; and an organic light emitting diode electrically connected to a driving drain electrode of the driving transistor, wherein the driving source electrode is separated from the data line.

The display may include a semiconductor layer including a switching channel of the switching transistor on the substrate and a driving channel of the driving transistor; and a first gate insulating layer covering the semiconductor, wherein the driving source electrode includes a same layer as the driving channel and is adjacent to the driving channel. The driving channel may be curved on a plane.

The display may include a storage capacitor including a first storage electrode on the first gate insulating layer and overlapping the driving channel; a second gate insulating layer covering the first storage electrode; and a second storage electrode on the second gate insulating layer and overlapping the first storage electrode, wherein the first storage electrode is a driving gate electrode of the driving transistor.

The display may include an interlayer insulating layer covering the second storage electrode, wherein the data line is on the interlayer insulating layer. The display may include an emission control line parallel to the scan line and to transmit an emission control signal; and an operation control transistor to turn on based on the emission control signal and to transmit the driving voltage to the driving transistor, wherein the operation control transistor is separated from the data line.

The operation control transistor may include an operation control gate electrode that is a portion of the emission control line; an operation control channel overlapping the operation control gate electrode and formed in the semiconductor layer; and an operation control source electrode and an operation control drain electrode on the semiconductor layer and positioned at respective sides of the operation control channel, wherein the operation control channel, the operation control source electrode, and the operation control drain electrode are separated from the data line.

The organic light emitting diode display may be driven by an auto impulse driving (AID) dimming driving method, and the AID dimming driving method may set a predetermined range of luminance gray scale values by controlling an off-period length of the emission control signal transmitted through the emission control line. The display may include a passivation layer covering the interlayer insulating layer, wherein the organic light emitting diode includes a pixel electrode on the passivation layer, an organic emission layer formed on the pixel electrode, and a common electrode on the organic emission layer.

In accordance with one or more other embodiments, a pixel includes a switching transistor connected to a scan line and a data line; a driving transistor connected to the switching transistor; an organic light emitting diode connected to the driving transistor; and an emission control transistor connected between the driving transistor and the organic light emitting diode, wherein the emission control transistor is to receive an emission control signal having an on-period that overlaps a porch period of a data signal on the data line, and wherein the driving transistor does not overlap the data line.

A source electrode of the driving transistor may not overlap the data line. The pixel ma include an operation control transistor connected between a power source voltage and the driving transistor, wherein the operation control transistor may not overlap the data line. A drain electrode of the operation control transistor may not overlap the data line. The operation control transistor may be separated from the data line by a first distance, and the driving transistor may be separated from the data line by a second distance. The first distance may be substantially equal to the second distance. The pixel may be driven by an auto impulse driving (AID) dimming driving method, and the AID dimming driving method may set a predetermined range of luminance gray scale values by controlling an off-period length of the emission control signal.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
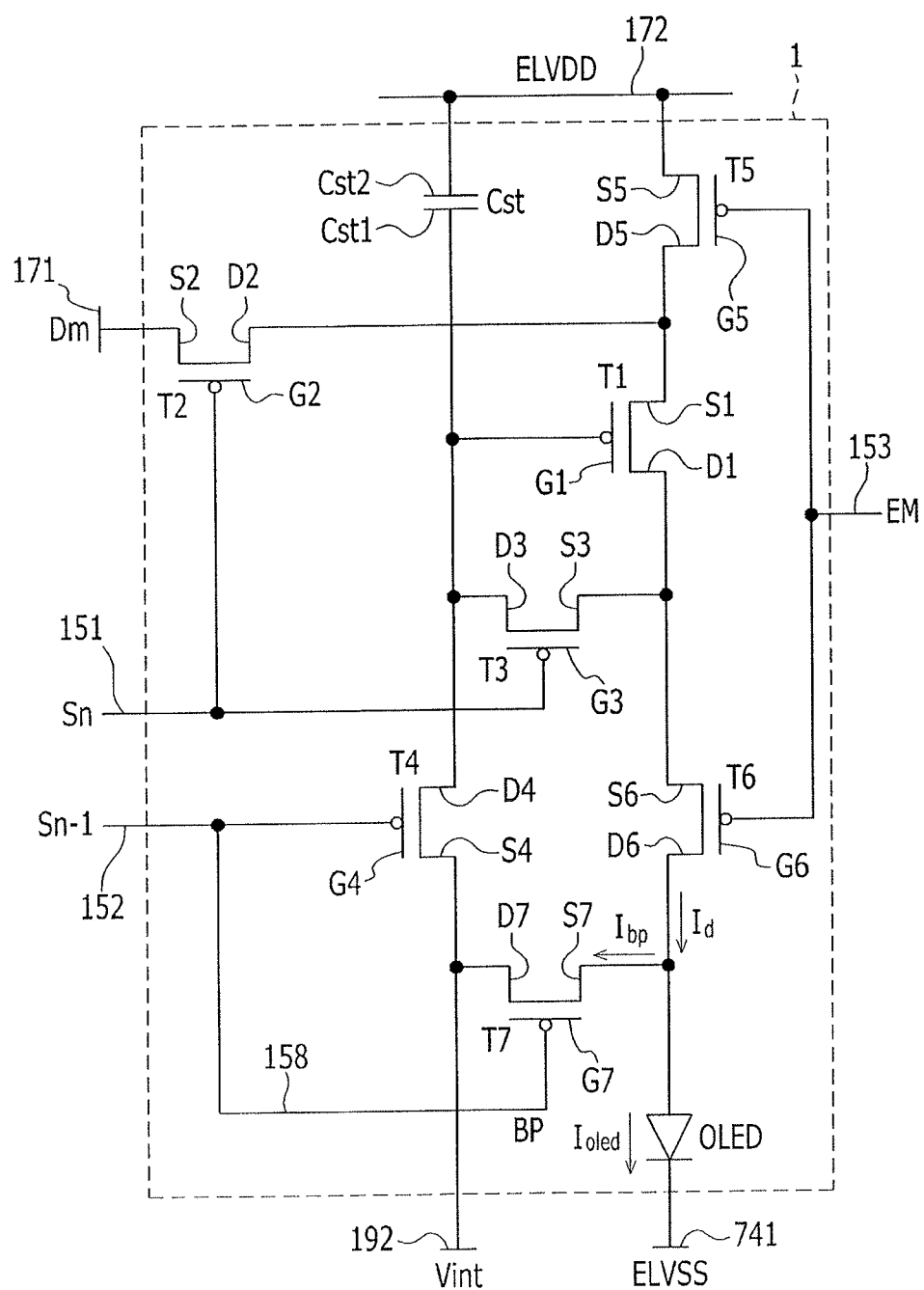
FIG. 1 illustrates an embodiment of a pixel.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 is an embodiment of a pixel 1, which, for example, may be included in an organic light emitting display. Referring to FIG. 1, the pixel 1 includes a plurality of transistors T1, T2, T3, T4, T5, T6, and T7 connected to a plurality of signal lines 151, 152, 153, 158, 171, 172, and 192, a storage capacitor Cst, and an organic light emitting diode OLED.

The transistors include a driving transistor T1, a switching transistor T2, a compensation transistor T3, an initialization transistor T4, an operation control transistor T5, a light emission control transistor T6, and a bypass transistor T7.

The signal lines include a scan line 151 for transferring a scan signal Sn, a previous scan line 152 for transferring a previous scan signal Sn−1 to the initialization transistor T4, a light emission control line 153 for transferring a light emission control signal EM to the operation control transistor T5 and the light emission control transistor T6, a bypass control line 158 for transferring a bypass signal BP to the bypass transistor T7, a data line 171 crossing the scan line 151 and for transferring a data signal Dm, a driving voltage line 172 for transferring a driving voltage ELVDD and formed to be substantially parallel with the data line 171, and an initialization voltage line 192 for transferring an initialization voltage Vint initializing the driving transistor T1.

The driving transistor T1 has a gate electrode G1 connected to one end Cst1 of the storage capacitor Cst, a source electrode S1 connected to the driving voltage line 172 via the operation control transistor T5, and a drain electrode D1 connected to the anode of the organic light emitting diode OLED via the light emission control transistor T6. The driving transistor T1 receives the data signal Dm according to a switching operation of the switching transistor T2, and supplies a driving current Id to the organic light emitting diode OLED based on the data signal Dm.

The switching transistor T2 has a gate electrode G2 connected to the scan line 151, a source electrode S2 connected to the data line 171, and a drain electrode D2 connected to the source electrode S1 of the driving transistor T1 and with the driving voltage line 172 via the operation control transistor T5. The switching transistor T2 is turned on by the scan signal Sn received through the scan line 151, to perform a switching operation for transferring the data signal Dm from the data line 171 to the source electrode of the driving transistor T1.

The compensation transistor T3 includes a gate electrode G3 directly connected to the scan line 151, a source electrode S3 connected to the drain electrode D1 of the driving transistor T1 and to the anode of the organic light emitting diode OLED via the emission control transistor T6, and a drain electrode D3 connected to one end Cst1 of the storage capacitor Cst and the drain electrode D4 of the initialization transistor T4, and the gate electrode G1 of the driving transistor T1. The compensation transistor T3 is turned on by the scan signal Sn from the scan line 151, to connect the gate electrode G1 and the drain electrode D1 of the driving transistor T1 and to place the driving transistor T1 in a diode-connected state.

The initialization transistor T4 has a gate electrode G4 connected to the previous scan line 152, a source electrode S4 connected to an initialization voltage line 154, and a drain electrode D4 connected to one end Cst1 of the storage capacitor Cst, the drain electrode D3 of the compensation transistor T3, and the gate electrode G1 of the driving transistor T1. The initialization transistor T4 is turned on according to a previous scan signal Sn−1 from the previous scan line 152, to transfer the initialization voltage Vint to the gate electrode G1 of the driving transistor T1 and to then perform an initialization operation for initializing the voltage of the gate electrode G1 of the driving transistor T1.

The operation control transistor T5 has a gate electrode G5 connected to the light emission control line 153, a source electrode S5 connected to the driving voltage line 172, and a drain electrode D5 connected to the source electrode S1 of the driving transistor T1 and the drain electrode S2 of the switching transistor T2.

The emission control transistor T6 has a gate electrode G6 connected to the light emission control line 153, a source electrode S6 connected to the drain electrode D1 of the driving transistor T1 and the source electrode S3 of the compensation transistor T3, and a drain electrode D6 connected to the anode of the organic light emitting diode OLED. The operation control transistor T5 and the first emission control transistor T6 are simultaneously turned on by the emission control signal EM from the light emission control line 153, to compensate the driving voltage ELVDD through the diode-connected driving transistor T1. The compensated driving voltage is used as a basis for generating current for the organic light emitting diode OLED.

The thin film bypass transistor T7 has a gate electrode G7 connected to the bypass control line 158, a source electrode S7 connected to the drain electrode D6 of the light emission control thin film transistor T6 and the anode of the organic light emitting diode OLED, and a drain electrode D7 connected to the initialization voltage line 192 and the source electrode S4 of the initialization thin film transistor T4. The bypass control line 158 is connected to the previous scan line 152 so that the bypass signal BP is the same previous scan signal Sn−1.

In addition, the driving voltage line 172 is connected to end Cst2 of the storage capacitor Cst, and the cathode of the organic light emitting diode OLED is connected to a common voltage line 741 for transferring a common voltage ELVSS.

In this embodiment, the pixel has seven transistors including the bypass transistor T7 and one capacitor. However, the pixel may have a different number of transistors and/or capacitors in another embodiment of the organic light emitting display.

Figure 2:
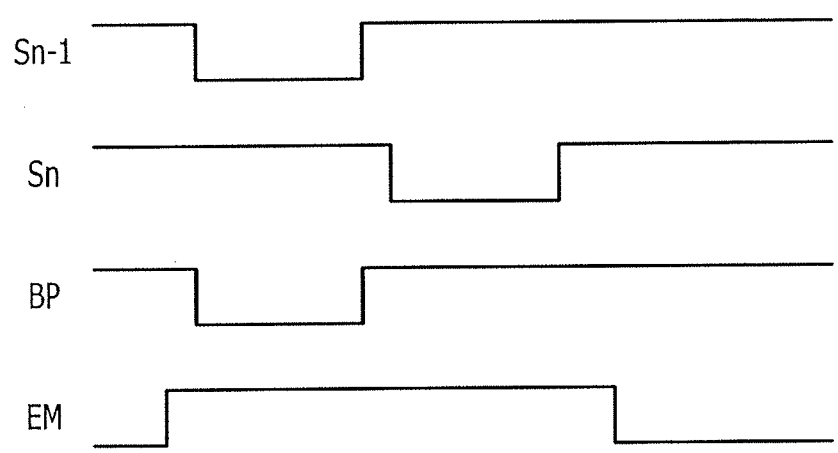
FIG. 2 illustrates an example of control signals for the pixel.

FIG. 2 is a timing diagram illustrating an example of control signals for pixel 1. Referring to FIG. 2, in an initializing period, a low level of the previous scan signal S(n−1) is supplied through the previous scan line 152. Then, the initializing thin film transistor T4 is turned on by the low level of the previous scan signal S(n−1), and the initial voltage Vint from the initialization voltage line 192 is provided through the initializing thin film transistor T4 for input into the gate electrode G1 of the driving transistor T1. The driving thin film transistor T1 is then initialized by the initialization voltage Vint.

In a data programming period, a low level of the scan signal Sn is supplied through the scan line 151, and the switching thin film transistor T2 and the compensating thin film transistor T3 are turned on by the scan signal Sn. At this time, the driving transistor T1 is diode-connected based on the turned-on compensation transistor T3 and is biased in a forward direction.

Then, a compensation voltage is applied to the gate electrode G1 of the driving thin film transistor T1. The compensation voltage corresponds to the data signal Dm from data line 171 reduced by a threshold voltage Vth of the driving thin film transistor T1, e.g., the compensation voltage is equal to or based on Dm+Vth, where Vth is a negative value. The driving voltage ELVDD and the compensation voltage (Dm+Vth) are applied to respective terminals of the storage capacitor Cst, and a charge corresponding to a voltage difference between the terminals is stored in the storage capacitor Cst.

In an emission period, the emission control signal EM from the emission control line 153 changes from a high level to a low level. As a result, the operation control transistor T5 and the emission control transistor T6 are turned on by the low level of the emission control signal EM during the emission period.

Thus, a driving current Id is generated based on a voltage difference between the gate voltage of the gate electrode G1 of the driving transistor T1 and the driving voltage ELVDD. The driving current Id is supplied to the organic light emitting diode (OLED) through the emission control transistor T6.

The gate-source voltage Vgs of the driving thin film transistor T1 is maintained as "(Dm+Vth)−ELVDD" by the storage capacitor Cst for the emission period. Based on a current-voltage relationship of the driving thin film transistor T1, the driving current Id is proportional to the square "(Dm−ELVDD)$^2$" of a value obtained by subtracting the threshold voltage from the source-gate voltage. Accordingly, the driving current Id is determined regardless of the threshold voltage Vth of the driving thin film transistor T1.

In this case, the bypass transistor T7 is turned on based on the bypass signal BP from the bypass control line 158 and the portion of the driving current Id is discharged as the bypass current Ibp through the bypass transistor T7.

When the driving current of the driving transistor T1 corresponds to a residual or predetermined (e.g., minimum) current for displaying a black image, a black image is not normally displayed if the organic light emitting diode OLED emits some light. Accordingly, in one embodiment, the bypass transistor T7 may disperse the portion of the residual or predetermined current of the driving transistor T1 as bypass current Ibp through a current path other than the current path of the organic light emitting diode side.

When the predetermined current is a minimum current of the driving transistor T1, this condition may correspond to the case where the driving transistor T1 is turned off, since the gate-source voltage Vgs of the driving transistor T1 is less than the threshold voltage Vth. The minimum driving current (for example, a current of 10 pA or less) under the condition in which the driving transistor T1 is turned off is transferred to the organic light emitting diode OLED for expressing an image with black luminance.

When the minimum driving current expressing the black image flows, influence on a bypass transfer of the bypass current Ibp may be significant, but when a large driving current expressing an image (such as a normal image or a white image) flows, there may be little influence on the bypass current Ibp. Accordingly, when the driving current displaying a black image flows, the light emission current Ioled of the organic light emitting diode OLED, which is reduced by the current amount of the bypass current Ibp which flows out from the driving current Id through the bypass transistor T7, has a minimum current amount corresponding to a level which may exactly express the black image. Therefore, a black luminance image is exactly implemented using the bypass transistor T7, thereby improving contrast ratio. In FIG. 2, the bypass signal BP is the same as a next scan signal Sn+1. However, the bypass signal may be different from the next scan signal Sn+1 in another embodiment.

An organic light emitting diode display including pixels such as in FIG. 1 may be driving according to an auto impulsive driving (AID) dimming driving method to express light of low gray scale values.

In one embodiment, the dimming driving method sets a maximum luminance reference value and a low luminance gray based on a gamma curve defining luminance for each gray scale value. Also, this embodiment of the AID dimming driving method may control the off period length of the emission control signal EM to be realized when setting the low luminance by dimming. For example, when realizing a luminance of 2 nit (cd/m2) for a gamma curve having 255 gray scale values, a 255 gray scale value of a maximum luminance reference value may be set as 100 nit (cd/m2), and 98% of one cycle of the emission control signal EM is set as an off period to express the luminance of 2 nit. This will be described, for example, with reference to FIG. 3.

Figure 3:
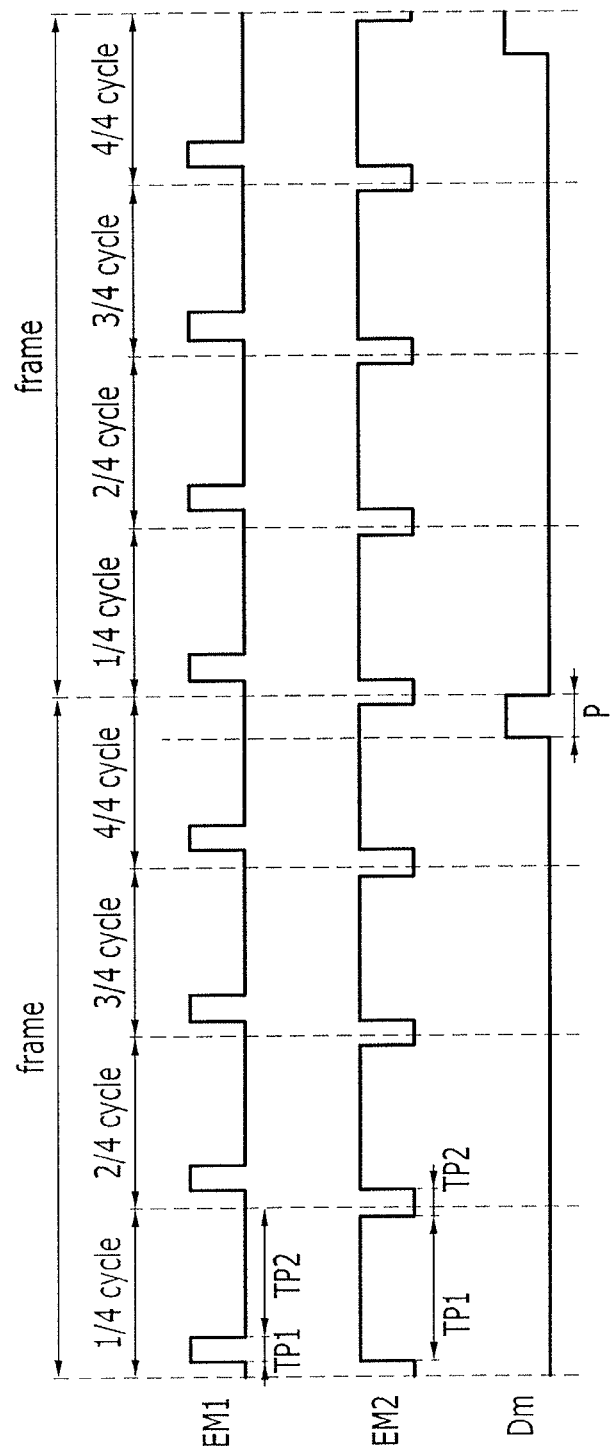
FIG. 3 illustrates one type of AID dimming driving method.

FIG. 3 is a timing diagram illustrating control signals for an AID dimming driving method for controlling an organic light emitting diode display. In this case, the emission control signal EM of four cycles is transmitted in one frame.

Referring to FIG. 3, in the timing diagram EM1 of the emission control signal EM, the off-period TP1 of the emission control signal EM for expressing low gray scale values is shorter than the on-period TP. However, in the timing gram EM2 of the emission control signal EM used in the AID dimming driving method, the off-period TP1 of the emission control signal EM is longer than the on-period TP2 to express low gray scale values.

In this case, the data signal Dm has a porch section P output as a black voltage for one frame. When the porch section P and the on-period TP2 of the emission control signal EM overlap each other, and particularly when the data line 171 and the driving source electrode 136a of the driving transistor T1 respectively transmitting the data signal Dm and the emission control signal EM overlap each other, horizontal line patterns are generated by mutual action therebetween. For example, when the emission control signal EM of two cycles is transmitted at one frame, one horizontal line pattern is generated as shown in FIG. 3. When the emission control signal EM of four cycles is transmitted at one frame, three horizontal line patterns are generated.

Accordingly, the number of the horizontal line patterns changes based on a cycle number of the emission control signal EM transmitted at one frame. Also, the intensity of the horizontal line pattern changes based on the magnitude of the black voltage, and the horizontal line pattern strongly appears when the black voltage is increased.

Figure 4:
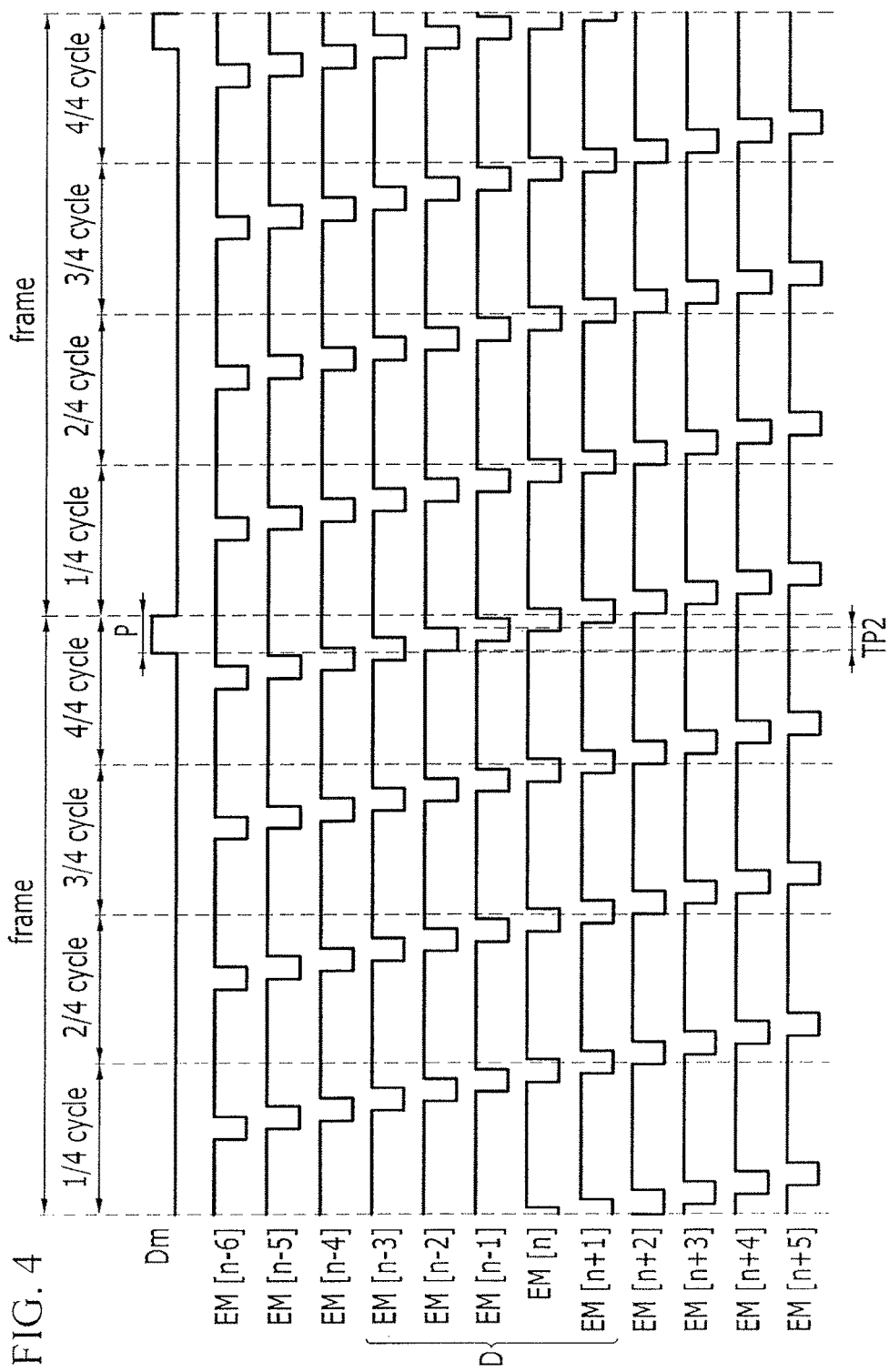
FIG. 4 illustrates an embodiment of an AID dimming driving method.

FIG. 4 is a timing diagram illustrating control signals for another AID diming driving method. This method is performed based on a period D in which an on-period TP2 of a emission control signal and a porch section P of a data signal overlap. This period D is generated based on the output position of an emission control signal.

Referring to FIG. 4, when the output position of the emission control signal EM corresponds to a predetermined position, the on-period TP2 of the emission control signal EM overlaps the porch section (or period) P of the data signal. In FIG. 4, the output position of the emission control signal EM is EM(n−3) to EM(n+1) and the on-period TP2 of the emission control signal EM overlaps the porch section P.

In this case, if the data line 171 overlaps the driving source electrode, the driving current Id is reduced by parasitic capacitance therebetween. Accordingly, the driving current of the pixels in which the output position of the emission control signal EM corresponds to the EM(n−3) to EM(n+1) may be reduced. As a result, the luminance of these pixels may be lower than the luminance of the surrounding pixels, thereby producing the appearance of horizontal line patterns which degrades display quality.

In one embodiment of the organic light emitting display, the driving source electrode 136a of the driving transistor T1 and the data line 171 are separated so that they do not overlap each other, thereby reducing or preventing the generation of the horizontal line patterns.

Figure 5:
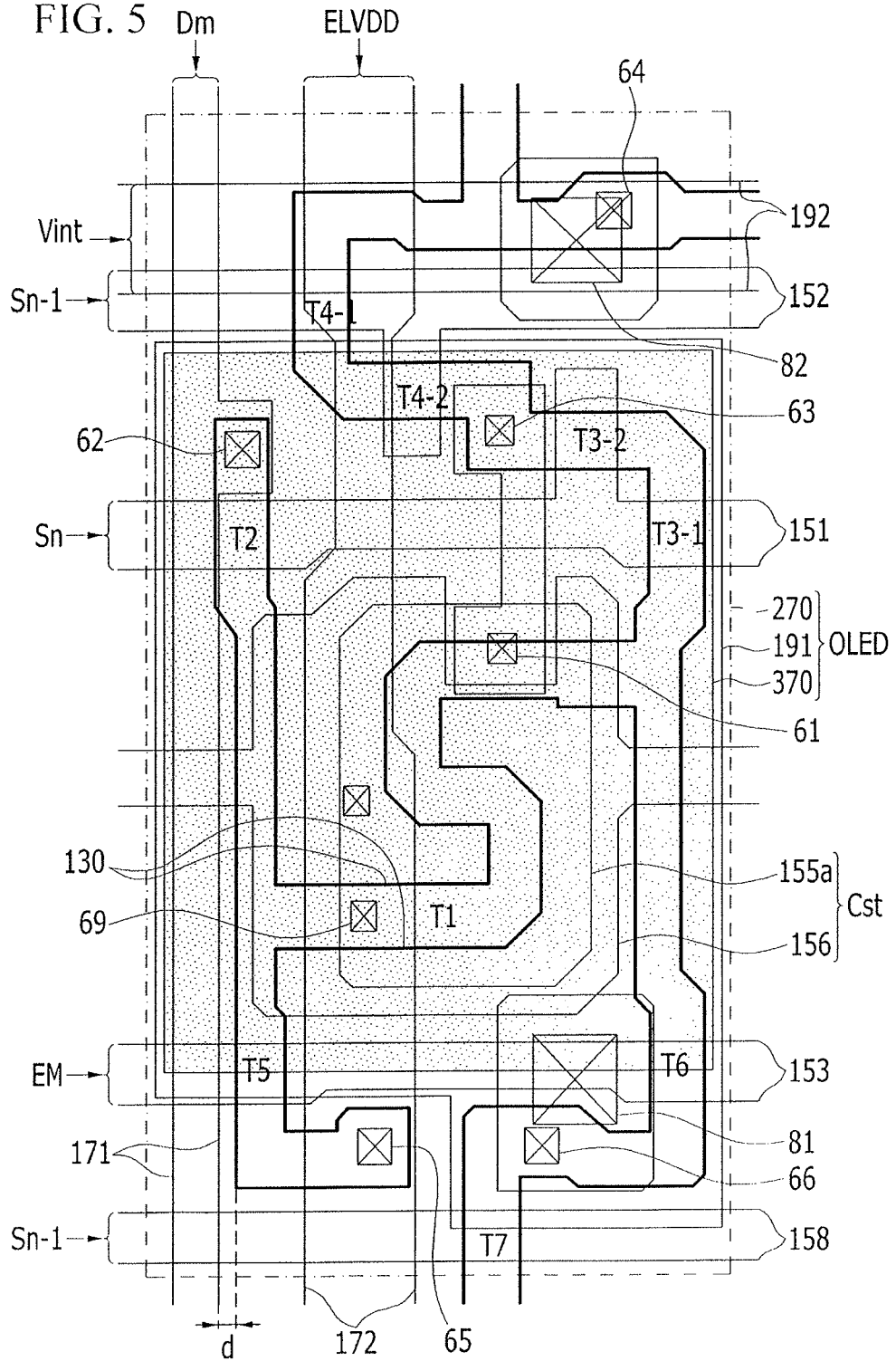
FIG. 5 illustrates a layout view of the pixel.
Figure 6:
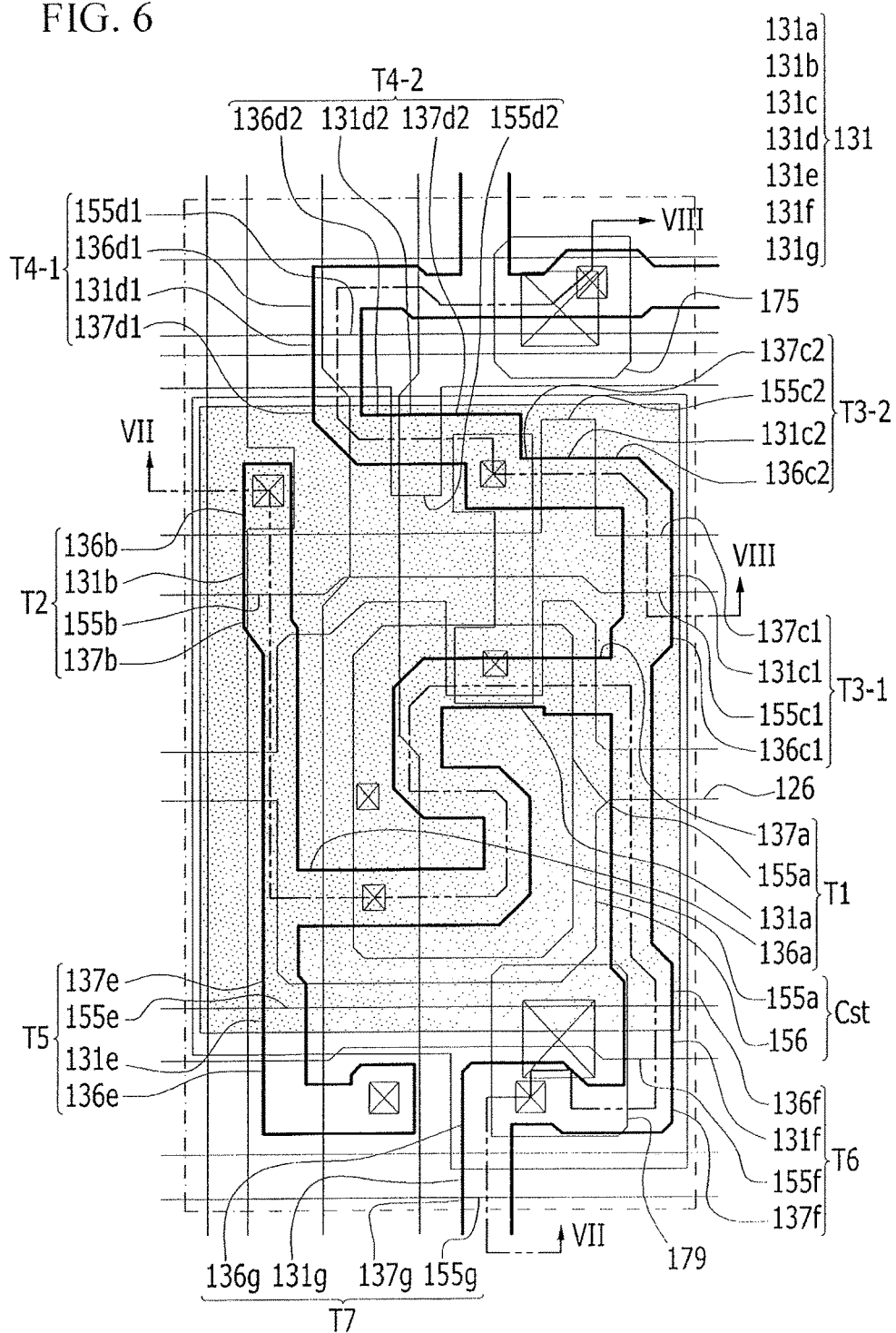
FIG. 6 illustrates another view of the pixel in FIG. 5.
Figure 7:
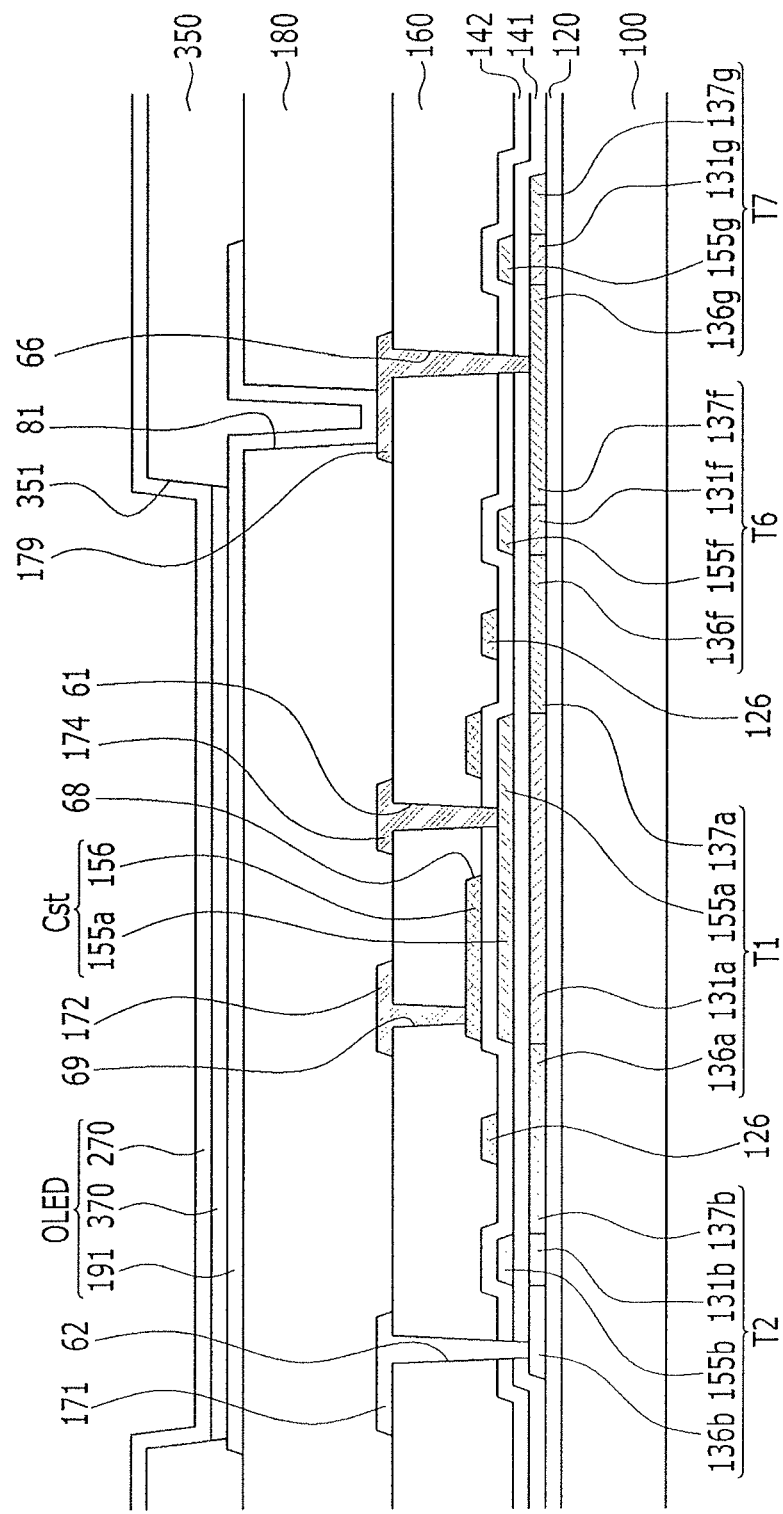
FIG. 7 illustrates a view along section line VII-VII in FIG. 6.
Figure 8:
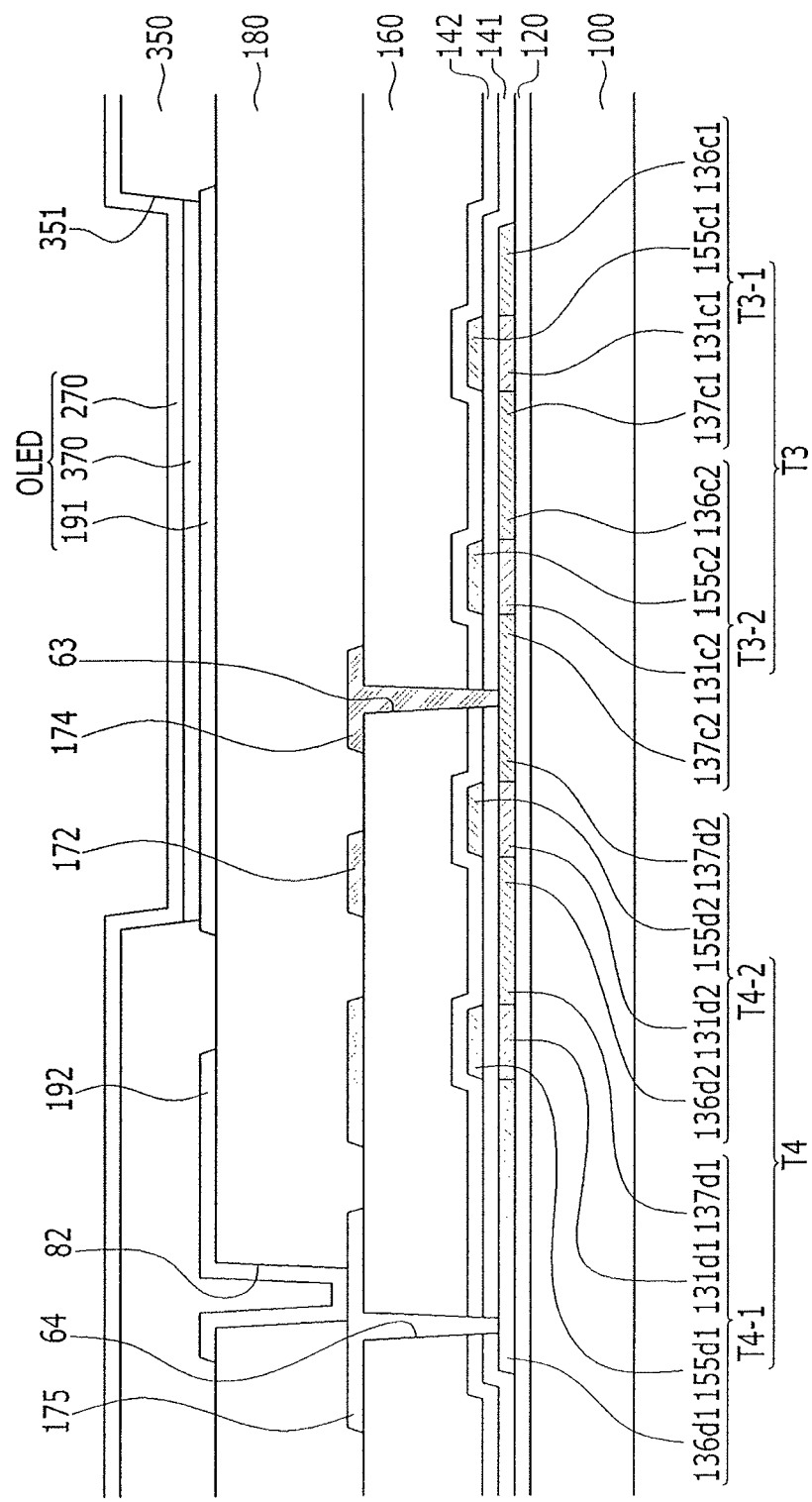
FIG. 8 illustrates a view along section line VIII-VIII in FIG. 6.

FIGS. 5 to 8 illustrate an embodiment of pixel 1 in an organic light emitting diode display. FIG. 5 illustrates a planar structure of a pixel including a plurality of transistors and capacitors, and FIG. 6 illustrates a layout view of the pixel in FIG. 5. FIG. 7 is a cross-sectional view of FIG. 6 taken along line VII-VII, and FIG. 8 is a cross-sectional view of FIG. 6 along line VIII-VIII.

Referring to FIG. 5, an embodiment of a layout view of pixel 1 includes a scan line 151, a previous scan line 152, an emission control line 153, and a bypass control line 158 extending in a row direction. These lines respectively transmit a scan signal Sn, a previous scan signal Sn−1, an emission control signal EM, and a bypass signal BP. A data line 171 and a driving voltage line 172 cross the scan line 151. The previous scan line 152, the emission control line 153, and the bypass control line 158 respectively apply data signal Dm and driving voltage ELVDD for pixel 1. The initialization voltage Vint is transmitted from the initialization voltage line 192 through the initialization transistor T4 to the compensation transistor T3.

Further, pixel 1 includes the driving thin film transistor T1, a switching thin film transistor T2, a compensation thin film transistor T3, an initialization thin film transistor T4, an operation control thin film transistor T5, an emission control thin film transistor T6, a bypass thin film transistor T7, a storage capacitor Cst, and an organic light emitting diode OLED. The organic light emitting diode OLED includes a pixel electrode 191, an organic emission layer 370, and a common electrode 270. In this embodiment, the compensation transistor T3 and the initialization transistor T4 are dual-gate structure transistors, which may reduce or block leakage current.

Channels of the driving transistor T1, the switching transistor T2, the compensation transistor T3, the initialization transistor T4, the operation control transistor T5, the light emission control transistor T6, and the bypass transistor T7 are formed in one semiconductor layer 130 connected thereto. The semiconductor layer 130 may have various any one of a plurality of curved shapes.

The semiconductor layer 130 may include, for example, a polycrystalline semiconductor material or an oxide semiconductor material. The oxide semiconductor material may include, for example, an oxide based on titanium (Ti), hafnium (Hf), zirconium (Zr), aluminum (Al), tantalum (Ta), germanium (Ge), zinc (Zn), gallium (Ga), tin (Sn), or indium (In), and indium-gallium-zinc oxide (InGaZnO4), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O) which is a compound oxide thereof. A separate passivation layer may be included for protecting the oxide semiconductor material, which may be vulnerable to external environmental conditions such as a high temperature.

Referring to FIGS. 5 to 8, the semiconductor layer 130 includes a channel 131 doped with an N-type impurity or a P-type impurity. A source doping part and a drain doping part are at respective sides of the channel and are doped with a doping impurity opposite to the doping impurity of the channel. In one exemplary embodiment, the source doping part and the drain doping part correspond to the source electrode and the drain electrode, respectively. The source electrode and the drain electrode in the semiconductor layer 130 may be formed, for example, by doping only the corresponding regions. Further, in the semiconductor layer 130, a region is doped between source electrodes and drain electrodes of different transistors is doped. Thus, the source electrode and the drain electrode may be electrically connected to each other.

The channel 131 includes a driving channel 131a formed in the drive transistor T1, a switching channel 131b formed in the switching transistor T2, a compensation channel 131c formed in the compensation transistor T3, an initialization channel 131d formed in the initialization transistor T4, an operation control channel 131e formed in the operation control transistor T5, a light emission control channel 131f formed in the light emission control transistor T6, and a bypass channel 131g formed in the bypass transistor T7.

The driving transistor T1 includes the driving channel 131a, a driving gate electrode 155a, the driving source electrode 136a, and a driving drain electrode 137a. The driving channel 131a is curved and, for example, may have an meandering shape or a zigzag shape. Forming the driving channel 131a to be curved may increase the length of the driving channel 131a within a narrow space. Accordingly, the driving range of the gate voltage applied to the driving gate electrode 155a is therefore increased by the elongated driving channel 131a.

Since the driving range of the gate voltage is increased, the gray scale of light emitted from the organic light emitting diode OLED may be finely controlled by changing the magnitude of the gate voltage. As a result, the resolution of the organic light emitting diode display device may be enhanced and display quality may be improved. The driving channel 131a may have various other curved shapes. Examples include 'reverse S', 'S', 'M', and 'W' shapes.

The driving gate electrode 155a overlaps the driving channel 131a. The driving source electrode 136a and the driving drain electrode 137a are formed at respective sides of the driving channel 131a to be close. The driving gate electrode 155a is connected to the first data connecting member 174 through a contact hole 61.

The driving source electrode 136a is separated from the data line 171 by a predetermined interval "d" so that the driving source electrode 136a and the data line 171 do not overlap. Accordingly, parasitic capacitance between the driving source electrode 136a and the data line 171 may be reduced, minimized, or prevented. As a result, interference between the driving voltage ELVDD transmitted to the driving source electrode 136a and the data signal Dm transmitted through the data line is reduced, minimized, or prevented. Accordingly, even though the output position of the emission control signal EM is such that the on-period TP2 of the emission control signal EM overlaps the porch section P of the data signal, the driving current Id is not reduced and, thus, horizontal line patterns are not generated.

Figure 9:
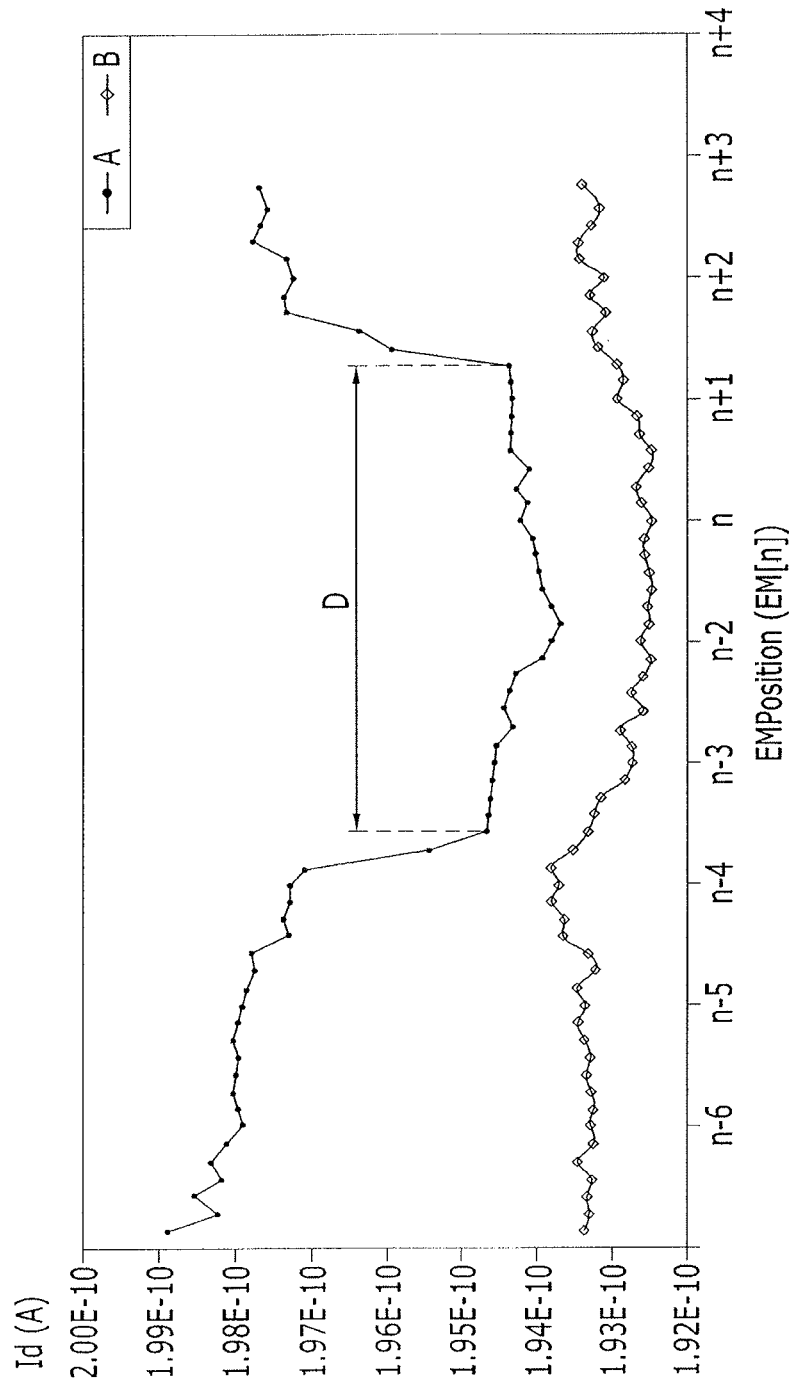
FIG. 9 illustrates an example of the magnitude of driving current based on output position of an emission control signal during AID dimming driving.

FIG. 9 is a graph showing an example of the magnitude of a driving current Id according to the output position of an emission control signal in one embodiment of an AID dimming driving method. In FIG. 9, curve A corresponds to a proposed AID dimming driving method and curve B corresponds to an embodiment of the AID dimming driving method described herein.

Referring to FIG. 9, in the proposed method, the output position of the emission control signal EM corresponds to a predetermined position, and the driving current Id is decreased. This position corresponds where the on-period TP2 of the emission control signal EM overlaps the porch section P overlap, as shown in FIG. 3.

However, in accordance with one embodiment of the AID dimming driving method and with reference to FIGS. 5 to 8, even though the output position of the emission control signal EM corresponds to the position where the on-period TP2 of the emission control signal EM overlaps the porch section P overlap, the driving current Id is not reduced. Accordingly, horizontal line patterns are not generated when this embodiment of the AID dimming driving method is applied.

Also, the operation control transistor T5 is separated from the data line 171 by a predetermined interval "d" to prevent overlap between the operation control transistor T5 and the data line 171. Thus, the operation control channel 131e, an operation control gate electrode 155e, an operation control source electrode 136e, and an operation control drain electrode 137e of the operation control transistor T5 are respectively separated from the data line 171. Generation of parasitic capacitance between the operation control transistor T5 and the data line 171 may therefore be reduced, minimized, or prevented, to thereby reduce, minimize, or prevent generation of the horizontal line patterns.

On the other hand, the switching transistor T2 includes the switching channel 131b, a switching gate electrode 155b, a switching source electrode 136b, and a switching drain electrode 137b. The switching gate electrode 155b, which is a part extending downwards from the scan line 121, overlaps the switching channel 131b. Also, the switching source electrode 136b and the switching drain electrode 137b are closely formed at respective sides of the switching channel 131b. The switching source electrode 136b is connected to the data line 171 through a contact hole 62.

Two compensation transistors T3 are formed to prevent the leakage current, and include a first compensation transistor T3-1 and a second compensation transistor T3-2 which are adjacent to each other. The first compensation transistor T3-1 is around the scan line 121, and the second compensation transistor T3-2 is around a projection of the scan line 121. The first compensation transistor T3-1 includes a first compensation channel 131c1, a first compensation gate electrode 155c1, a first compensation source electrode 136c1, and a first compensation drain electrode 137c1, and the second compensation transistor T3-2 includes a second compensation channel 131c2, a second compensation gate electrode 155c2, a second compensation source electrode 136c2, and a second compensation drain electrode 137c2.

The first compensation gate electrode 155c1, which is a part of the scan line 121, overlaps the first compensation channel 131c1. The first compensation source electrode 136c1 and the first compensation drain electrode 137c1 are closely formed at respective sides of the first compensation channel 131c1. The first compensation source electrode 136c1 is connected to a light emission control source electrode 136f and the driving drain electrode 137a, and the first compensation drain electrode 137c1 is connected to the second compensation source electrode 136c2.

The second compensation gate electrode 155c2, which is a projection protruding upward from the scan line 121, overlaps the second compensation channel 131c2. The second compensation source electrode 136c2 and the second compensation drain electrode 137c2 are closely formed at respective sides of the second compensation channel 131c2. The second compensation drain electrode 137c2 is connected to a first data connection member 174 through a contact hole 63.

Two initialization transistors T4 are formed to prevent the leakage current, and include a first initialization transistor T4-1 and a second initialization transistor T4-2 which are adjacent to each other. The first initialization transistor T4-1 is around the previous scan line 122, and the second initialization transistor T4-2 is around a projection of the previous scan line 122. The first initialization transistor T4-1 includes a first initialization channel 131d1, a first initialization gate electrode 155d1, a first initialization source electrode 136d1, and a first initialization drain electrode 137d1, and the second initialization transistor T4-2 includes a second initialization channel 131d2, a second initialization gate electrode 155d2, a second initialization source electrode 136d2, and a second initialization drain electrode 137d2.

The first initialization gate electrode 155d1, which is a part of the previous scan line 152, overlaps with the first initialization channel 131d1 and is closely formed at respective sides of the first initialization channel 131*d*1. The first initialization source electrode 136*d*1 is connected to a second data connection member 175 through a contact hole 64, and the first initialization drain electrode 137*d*1 is connected to the second initialization source electrode 136*d*2.

The second initialization gate electrode 155*d*2, which is a projection protruding downward from the previous scan line 152, overlaps the second initialization channel 131*d*2. The second initialization source electrode 136*d*2 and the second initialization drain electrode 137*d*2 are closely formed at respective sides of the second initialization channel 131*c*2. The second initialization drain electrode 137*d*2 is connected to the first data connection member 174 through the contact hole 63.

The compensation transistor T3 includes two of the first compensation transistor T3-1 and the second compensation transistor T3-2. The initialization transistor T4 includes two of the first initialization transistor T4-1 and the second initialization transistor T4-2. As a result, it is possible to efficiently prevent the leakage current from being generated by blocking an electron moving path of the semiconductor layer 130 in the off-state.

The operation control transistor T5 includes the operation control channel 131*e*, an operation control gate electrode 155*e*, the operation control source electrode 136*e*, and the operation control drain electrode 137*e*. The operation control gate electrode 155*e* which is a part of the light emission control line 153 overlaps with the operation control channel 131*e*. The operation control source electrode 136*e* and the operation control drain electrode 137*e* are closely formed at respective sides of the operation control channel 131*e*. The operation control source electrode 136*e* is connected to part of the driving voltage line 172 through a contact hole 65.

The light emission control transistor T6 includes the light emission control channel 131*f*, a light emission control gate electrode 155*f*, the light emission control source electrode 136*f*, and a light emission control drain electrode 137*f*. The light emission control gate electrode 155*f*, which is a part of the light emission control line 153, overlaps the light emission control channel 131*f* The emission control source electrode 136*f* and the emission control drain electrode 137*f* are closely formed at respective sides of the emission control channel 131*f*. The light emission control drain electrode 137*f* is connected to a third data connection member 179 through a contact hole 66.

The bypass transistor T7 includes the bypass channel 131*g*, a bypass gate electrode 155*g*, a bypass source electrode 136*g*, and a bypass drain electrode 137*g*. The bypass gate electrode 155*g*, which is a part of the bypass control line 128, overlaps the bypass channel 131*g*. The bypass source electrode 136*g* and the bypass drain electrode 137*g* are closely formed at respective sides of the bypass channel 131*g*. The bypass source electrode 136*g* is connected through a contact hole 81 to the third data connecting member 179, and the bypass drain electrode 137*g* is connected directly to the first initialization source electrode 136*d*1.

One end of the driving channel 131*a* of the driving transistor T1 is connected to the switching drain electrode 137*b* and the operation control drain electrode 137*e*. The other end of the driving channel 131*a* is connected to the compensation source electrode 136*c* and the light emission control source electrode 136*f*.

The storage capacitor Cst includes the first storage electrode 155*a* and a second storage electrode 156 with a second insulating layer 142 therebetween. The first storage electrode 155*a* corresponds to the driving gate electrode 155*a*.

The second storage electrode 156 extends from a storage line 126, occupies a larger area than the driving gate electrode 155*a*, and fully covers the driving gate electrode 155*a*. A second insulating layer 142 includes a dielectric material, and a storage capacitance is determined by charges stored in the storage capacitor Cst and a voltage between the two electrodes 155*a* and 156. As such, the driving gate electrode 155*a* is used as the first storage electrode 155*a*. As a result, it is possible to provide a space in which the storage capacitor may be formed, where the space is narrowed by the driving channel 131*a* having a large area in the pixel.

The first storage electrode 155*a*, which is the driving gate electrode 155*a*, is connected to one end of the first data connection member 174 through the contact hole 61 and a storage opening 68. The storage opening 68 is an opening in the second storage electrode 156. The first data connection member 174 is on the same layer and is substantially parallel to the data line 171. The other end of the first data connection member 174 is connected with the second compensation drain electrode 137*c*2 of the second compensation transistor T3-2 and the second initialization drain electrode 137*d*2 of the second initialization transistor T4-2 through the contact hole 63. Accordingly, the first data connection member 174 connects the driving gate electrode 155*a* and the second compensation drain electrode 137*c*2 of the second compensation transistor T3-2, and the second initialization drain electrode 137*d*2 of the second initialization transistor T4-2, to each other.

The second storage electrode 156 is connected to the driving voltage line 172 through a contact hole 69. Accordingly, the storage capacitor Cst stores a voltage corresponding to a difference between the driving voltage ELVDD transferred to the second storage electrode 156 through the driving voltage line 172 and the gate voltage Vg of the driving gate electrode 155*a*.

The third data connection member 179 is connected with the pixel electrode 191 through the contact hole 81. The second data connection member 175 is connected with the initialization voltage line 192 through a contact hole 82.

FIGS. 7 and 8 illustrate cross-sectional view of the pixel 1 and a peripheral unit in the organic light emitting diode display device. The lamination structure of the operation control transistor T5 may be mostly the same as the light emission control transistor T6.

Referring to FIGS. 7 and 8, a buffer layer 120 may be formed on a pixel substrate 100. The pixel substrate 100 may be formed by insulating substrates including, for example, glass, crystal, ceramic, or plastic. The buffer layer 120 blocks impurities from the pixel substrate 100 during a crystallization process for forming a polycrystalline semiconductor to serve to improve characteristics of the polycrystalline semiconductor and reduce stress applied to the pixel substrate 100.

On the buffer layer 120 of the pixel unit P, a semiconductor layer 130 is formed, which includes a driving channel 131*a*, a switching channel 131*b*, a compensation channel 131*c*, an initialization channel 131*d*, an operation control channel 131*e*, and a light emission control channel 131*f*. A driving source electrode 136*a* and a driving drain electrode 137*a* are formed at respective sides of the driving channel 131*a* in the semiconductor 130. A switching source electrode 136*b* and a switching drain electrode 137*b* are formed at respective sides of the switching channel 131*b*.

In addition, a first compensation source electrode 136*c*1 and a first compensation drain electrode 137*c*1 are formed at respective sides of a first compensation channel 131*c*1. A second compensation source electrode 136*c*2 and a second compensation drain electrode 137c2 are formed at respective sides of a second compensation channel 131c2. A first initialization source electrode 136d1 and a first initialization drain electrode 137d1 are formed at respective sides of a first initialization channel 131d1. A second initialization source electrode 136d2 and a second initialization drain electrode 137d2 are formed at respective sides of a second initialization channel 131d2.

Further, an operation control source electrode 136e and an operation control drain electrode 137e are formed at respective sides of the operation control channel 131e. A light emission control source electrode 136f and a light emission control drain electrode 137f are formed at respective sides of the light emission control channel 131f. Also, a bypass source electrode 136g and a bypass drain electrode 137g are formed at respective sides of the bypass channel 131g.

A first insulating layer 141 covering the semiconductor layer 130 may correspond to the semiconductor layer 130. First gate wirings are formed on the first insulating layer 141. The first gate wirings include a scan line 151 including a switching gate electrode 155b, a first compensation gate electrode 155c1, and a second compensation gate electrode 155c2, a previous scan line 152 including a first initialization gate electrode 155d1 and a second initialization gate electrode 155d2, a light emission control line 153 including an operation control gate electrode 155e and a light emission control gate electrode 155f, a bypass control line 158 including the bypass gate electrode 155g, and a driving gate electrode (first storage electrode) 155a.

A second gate insulating layer 142 is formed to cover the first gate wirings 151, 152, 153, 158, 155a, 155b, 155c1, 155c2, 155d1, 155d2, 155e, and 155f and the first gate insulating layer 141. The first insulating layer 141 and the second insulating layer 142 may include, for example, silicon nitride ($SiN_x$) or silicon oxide ($SiO_x$).

Second gate wirings include a storage line 126 parallel to the scan line 121 and a second storage electrode 156 extending from the storage line 126. The second fate wirings are formed on the second insulating layer 142.

An interlayer insulating layer 160 is formed on the second gate insulating layer 142 and the second gate wiring 126 and 156. The interlayer insulating layer 160 may be include, for example, silicon nitride ($SiN_x$) or silicon oxide ($SiO_x$).

The interlayer insulating layer 160 has contact holes 61, 62, 63, 64, 65, 66, and 69. A data line 171, a driving voltage line 172, a first data connecting member 174, a second data connecting member 175, and a third data connecting member 179 are formed on the interlayer insulating layer 160.

The data line 171 is connected to the switching source electrode 136b through the contact hole 62 in the first gate insulating layer 141, the second gate insulating layer 142, and the interlayer insulating layer 160. One end of the first data connecting member 174 is connected to the first storage electrode 155a through the contact hole 61 in the second gate insulating layer 142 and the interlayer insulating layer 160. The other end of the first data connecting member 174 is connected to the second compensation drain electrode 137c2 and the second initialization drain electrode 137d2 through the contact hole 63 in the first gate insulating layer 141, the second gate insulating layer 142, and the interlayer insulating layer 160.

A quadrangular second data connection member 175 is connected to the first initialization source electrode 136d1 through the contact hole 64 formed in the first gate insulating layer 141, the second gate insulating layer 142, and the interlayer insulating layer 160. In addition, a quadrangular third data connection member 179 is connected to the light emission control drain electrode 137f through the contact hole 66 in the first gate insulating layer 141, the second gate insulating layer 142, and the interlayer insulating layer 160.

A passivation layer 180 covering the data wirings 171, 172, 174, 175, and 179, and the interlayer insulating layer 160 is formed thereon. The passivation layer 180 may include, for example, an organic layer.

The pixel electrode 191 and the initialization voltage line 192 are formed on the passivation layer 180. The third data connection member 179 is connected to the pixel electrode 191 through a contact hole 81 formed on the passivation layer 180. The second data connection member 175 is connected to the initialization voltage line 192 through a contact hole 82 formed on the passivation layer 180.

A pixel defined layer (PDL) 350 covering the passivation layer 180, the initialization voltage line 192, and the pixel electrode 191 is formed on edges of the passivation layer 180, the initialization voltage line 192, and the pixel electrode 191. The pixel defined layer 350 has a pixel opening 351 that exposes the pixel electrode 191. The pixel defined layer 350 may include one or more resins such as a polyacrylate resin and a polyimide or silica-series inorganic materials.

An organic emission layer 370 is formed on the pixel electrode 191 exposed by the pixel opening 351. A common electrode 270 is formed on the organic emission layer 370. The common electrode 270 is formed on the pixel defined layer 350 to be formed through the pixels. As such, an organic light emitting diode OLED is formed to include the pixel electrode 191, the organic emission layer 370, and the common electrode 270.

The pixel electrode 191 is an anode serving a hole injection electrode and the common electrode 270 is a cathode serving as electron injection electrode. In another embodiment, the pixel electrode 191 may be the cathode and the common electrode 270 may be the anode. In operation, holes and electrons are injected into the organic emission layer 370 from the pixel electrode 191 and the common electrode 270, respectively, and combine. As a result, excitons form and light is emitted when the excions fall from an excitation state to a ground state.

The organic emission layer 370 includes, for example, a low-molecular organic material or a high-molecular organic material such as poly(3,4-ethylenedioxythiophene) (PEDOT). Further, the organic emission layer 370 may be formed by multiple layers including at least one of an emission layer, a hole injection layer (HIL), a hole transporting layer (HTL), an electron transporting layer (ETL), or an electron injection layer (EIL). When the organic emission layer 370 includes all of the layers, the hole injection layer may be disposed on the pixel electrode 191 which is the positive electrode, and the hole transporting layer, the emission layer, the electron transporting layer, and the electron injection layer may be sequentially laminated thereon.

The organic emission layer 370 may include a red organic emission layer emitting red light, a green organic emission layer emitting green light, and a blue organic emission layer emitting blue light. The red organic emission layer, the green organic emission layer, and the blue organic emission layer correspond to a red pixel, a green pixel, and a blue pixel, respectively, to implement color images.

Further, in the organic emission layer 370, all of the red organic emission layer, the green organic emission layer, and the blue organic emission layer are laminated on the red pixel, the green pixel, and the blue pixel. A red color filter, a green color filter, and a blue color filter are formed for each pixel to implement the color images.

In another example, a white organic emission layer emitting white light is formed on all of the red pixel, the green pixel, and the blue pixel. In this case, the red color filter, the green color filter, and the blue color filter are formed for each pixel to implement the color images. When the color images are implemented using the white organic emission layer and the color filters, a deposition mask for depositing the red organic emission layer, the green organic emission layer, and the blue organic emission layer on individual pixels (that is, the red pixel, the green pixel, and the blue pixel, respectively) may not be used.

In another example, the white organic emission layer may be formed by one organic emission layer, or may include a plurality of laminated organic emission layers that that emits white light. As an example, the white organic emission layer may include a combination of at least one yellow organic emission layer and at least one blue organic emission layer, a combination of at least one cyan organic emission layer and at least one red organic emission layer, or a combination of at least one magenta organic emission layer and at least one green organic emission layer.

An encapsulation material to protect the organic light emitting diode OLED may be formed on the common electrode 270. The encapsulation material may be sealed to the substrate 100 by a sealant and may include, for example, glass, quartz, ceramic, plastic, or metal. On the other hand, a thin film encapsulation layer may be formed on the common electrode 270 by depositing the inorganic layer and the organic layer with the usage of the sealant.

By way of summation and review, one type of an organic light emitting diode display is proposed to include a plurality of pixels, each pixel having a storage capacitor and plurality of thin film transistors for driving an organic light emitting diode. The transistors and the storage capacitor are formed of and/or connected to a plurality of wiring lines including a semiconductor, a gate line, or a data line. Horizontal line patterns are generated based on parasitic capacitance caused by overlapping ones of the wiring lines and/or transistors.

In accordance with one or more of the aforementioned embodiments, the driving transistor is separated from the data line so that they do not overlap. As a result, parasitic capacitance may be reduced, minimized, or prevented between the driving transistor and the data line. Accordingly, when the display is driven by an AID dimming driving method to express a low or other predetermined range of gray scale values, a driving current difference according to pixel position may be reduced to prevent the generation of horizontal line patterns that may degrade display quality.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An organic light emitting diode display, comprising:
   a substrate;
   a scan line on the substrate to transmit a scan signal;
   a data line and a driving voltage line crossing the scan line and to respectively transmit a data voltage and a driving voltage;
   a switching transistor connected to the scan line and the data line, the switching transistor including a switching drain electrode to output the data voltage;
   a driving transistor including a driving source electrode connected to the switching drain electrode; and
   an organic light emitting diode electrically connected to a driving drain electrode of the driving transistor, wherein a portion of the driving source electrode is separated from the data line on a plane view from above.

2. The display as claimed in claim 1, wherein a virtual extension line of a side wall of the data line and a virtual extension line of a side wall of the portion of the driving source electrode are spaced apart from each other.

3. The display as claimed in claim 1, further comprising:
   a semiconductor layer including a switching channel of the switching transistor on the substrate and a driving channel of the driving transistor; and
   a first gate insulating layer covering the semiconductor layer, wherein the driving source electrode includes a same layer as the driving channel and is adjacent to the driving channel, wherein the portion of the driving source electrode is disposed between the switching drain electrode and the driving channel.

4. The display as claimed in claim 3, wherein the driving channel is curved on a plain view from above.

5. The display as claimed in claim 3, further comprising:
   a storage capacitor including a first storage electrode on the first gate insulating layer and overlapping the driving channel;
   a second gate insulating layer covering the first storage electrode; and
   a second storage electrode on the second gate insulating layer and overlapping the first storage electrode, wherein the first storage electrode is a driving gate electrode of the driving transistor, and wherein the switching drain electrode is adjacent to a switching channel overlapping a switching gate electrode which is a portion of the scan line and the switching drain electrode does not overlap the second storage electrode.

6. The display as claimed in claim 5, further comprising:
   an interlayer insulating layer covering the second storage electrode,
   wherein the data line is on the interlayer insulating layer.

7. The display as claimed in claim 6, further comprising:
   an emission control line parallel to the scan line and to transmit an emission control signal; and
   an operation control transistor to turn on based on the emission control signal and to transmit the driving voltage to the driving transistor, wherein the operation control transistor is separated from the data line on a plain view from above.

8. The display as claimed in claim 7, wherein the operation control transistor includes:
   an operation control gate electrode that is a portion of the emission control line;
   an operation control channel overlapping the operation control gate electrode and disposed in the semiconductor layer; and
   an operation control source electrode and an operation control drain electrode on the semiconductor layer and positioned at respective sides of the operation control channel, wherein the operation control channel, the operation control source electrode, and the operation control drain electrode are separated from the data line on a plain view from above.

9. The display as claimed in claim 7, wherein:
the organic light emitting diode display is to be driven by an auto impulse driving (AID) dimming driving method, and
the AID dimming driving method is to set a predetermined range of luminance gray scale values by controlling an off-period length of the emission control signal transmitted through the emission control line.

10. The display as claimed in claim 6, further comprising:
a passivation layer covering the interlayer insulating layer,
wherein the organic light emitting diode includes a pixel electrode on the passivation layer, an organic emission layer disposed on the pixel electrode, and a common electrode on the organic emission layer.

11. A pixel, comprising:
a switching transistor connected to a scan line and a data line;
a driving transistor connected to the switching transistor;
an organic light emitting diode connected to the driving transistor; and
an emission control transistor connected between the driving transistor and the organic light emitting diode, wherein the emission control transistor is to receive an emission control signal having an on-period that overlaps a porch period of a data signal on the data line, and
wherein a portion of a source electrode of the driving transistor does not overlap the data line on a plane view from above.

12. The pixel as claimed in claim 11, wherein a virtual extension line of a side wall of the data line and a virtual extension line of a side wall of the portion of the source electrode of the driving transistor are spaced apart from each other.

13. The pixel as claimed in claim 11, further comprising:
an operation control transistor connected between a power source voltage and the driving transistor, wherein a drain electrode of the operation control transistor does not overlap the data line.

14. The pixel as claimed in claim 13, wherein:
the operation control transistor is separated from the data line by a first distance, and
the driving transistor is separated from the data line by a second distance.

15. The pixel as claimed in claim 14, wherein the first distance is substantially equal to the second distance.

16. The pixel as claimed in claim 11, wherein:
the pixel is to be driven by an auto impulse driving (AID) dimming driving method, and
the AID dimming driving method is to set a predetermined range of luminance gray scale values by controlling an off-period length of the emission control signal.

* * * * *